United States Patent
Zhu et al.

(10) Patent No.: US 9,995,569 B2
(45) Date of Patent: Jun. 12, 2018

(54) SIX-DEGREE-OF-FREEDOM DISPLACEMENT MEASUREMENT METHOD FOR EXPOSURE REGION ON SILICON WAFER STAGE

(71) Applicants: Tsinghua University, Beijing (CN); Beijing U-Precision Tech Co., Ltd., Beijing (CN)

(72) Inventors: Yu Zhu, Beijing (CN); Ming Zhang, Beijing (CN); Anlin Chen, Beijing (CN); Rong Cheng, Beijing (CN); Kaiming Yang, Beijing (CN); Feng Liu, Beijing (CN); Yujing Song, Beijing (CN); Fan Zhi, Beijing (CN); Jinchun Hu, Beijing (CN); Dengfeng Xu, Beijing (CN); Haihua Mu, Beijing (CN); Chuxiong Hu, Beijing (CN)

(73) Assignees: TSINGHUA UNIVERSITY, Beijing (CN); BEIJING U-PRECISION TECH CO., LTD., Beijing (CN)

( * ) Notice: Subject to any disclaimer, the term of this patent is extended or adjusted under 35 U.S.C. 154(b) by 0 days. days.

(21) Appl. No.: 15/568,118

(22) PCT Filed: Mar. 15, 2016

(86) PCT No.: PCT/CN2016/076395
§ 371 (c)(1),
(2) Date: Oct. 20, 2017

(87) PCT Pub. No.: WO2016/169362
PCT Pub. Date: Oct. 27, 2016

(65) Prior Publication Data
US 2018/0080757 A1  Mar. 22, 2018

(30) Foreign Application Priority Data
Apr. 23, 2015 (CN) .......................... 2015 1 0197948

(51) Int. Cl.
*G01B 11/14* (2006.01)
*G01N 11/04* (2006.01)
(Continued)

(52) U.S. Cl.
CPC ............ *G01B 11/14* (2013.01); *G03F 9/7046* (2013.01)

(58) Field of Classification Search
CPC ........ G01B 11/04; G01B 11/14; G01D 5/285; H02K 41/031; H02K 7/09; H02N 15/00; B23Q 3/15
See application file for complete search history.

(56) References Cited

U.S. PATENT DOCUMENTS 5,770,864 A * 6/1998 Dlugos ................ G01B 11/028
177/25.15
6,020,964 A 2/2000 Loopstra et al.
(Continued)

FOREIGN PATENT DOCUMENTS

CN 101078889 A 11/2007
CN 101482395 A 7/2009
(Continued)

OTHER PUBLICATIONS

International Search Report (PCT/CN2016/076395), dated May 31, 2016.
(Continued)

*Primary Examiner* — Sang Nguyen
(74) *Attorney, Agent, or Firm* — Howard & Howard Attorneys PLLC

(57) ABSTRACT

A six-degree-of-freedom displacement measurement method for an exposure region on a wafer stage, the wafer stage comprises a coil array and a movable platform. A planar grating is fixed below a permanent magnet array of the movable platform. A reading head is fixed in a gap of the
(Continued)

coil array. A measurement region is formed on the planar grating by an incident measurement light beam of the reading head. The reading head measures the six-degree-of-freedom displacement of the measurement region, so that the six-degree-of-freedom displacement of the exposure region is obtained through calculation. In the method, the six-degree-of-freedom displacement of the exposure region at any time is measured; the measurement complexity is reduced and the measurement precision is improved, and especially, the six-degree-of-freedom displacement of the exposure region can be precisely measured at any time even if the movable platform has high flexibility.

1 Claim, 1 Drawing Sheet

(51) Int. Cl.
  *G01D 5/28* (2006.01)
  *G03F 9/00* (2006.01)

(56) References Cited

U.S. PATENT DOCUMENTS

| | | | |
|---|---|---|---|
| 7,483,120 B2* | 1/2009 | Luttikhuis | G03B 27/53 355/53 |
| 7,612,889 B2* | 11/2009 | Nakata | G03F 7/70775 356/493 |
| 2008/0218713 A1* | 9/2008 | Shibazaki | G03F 7/70516 355/52 |
| 2009/0268178 A1* | 10/2009 | Shibazaki | G03F 7/70425 355/53 |
| 2010/0013860 A1* | 1/2010 | Mandella | G01B 21/04 345/650 |
| 2010/0053586 A1* | 3/2010 | Klaver | G01D 5/38 355/72 |
| 2012/0195994 A1* | 8/2012 | El-Siblani | B29C 67/007 425/174.4 |
| 2015/0085302 A1* | 3/2015 | Zhang | G01D 5/285 356/614 |
| 2015/0326150 A1* | 11/2015 | Zhu | H02K 41/031 269/8 |

FOREIGN PATENT DOCUMENTS

| | | |
|---|---|---|
| CN | 102221323 A | 10/2011 |
| CN | 102721369 A | 10/2012 |
| CN | 103019046 A | 4/2013 |
| CN | 103105743 A | 5/2013 |
| CN | 103454864 A | 12/2013 |
| CN | 103543612 A | 1/2014 |
| CN | 105045042 A | 11/2015 |
| EP | 0131155 A2 | 1/1985 |
| EP | 2672321 A1 | 12/2013 |
| JP | 2007149807 A | 6/2007 |

OTHER PUBLICATIONS

English Translation of Chinese Notification of the first Office Action with Original Chinese Notification of the first Office Action, (CN 2016102001423770), Issued Date: Oct. 25, 2016.

* cited by examiner

SIX-DEGREE-OF-FREEDOM DISPLACEMENT MEASUREMENT METHOD FOR EXPOSURE REGION ON SILICON WAFER STAGE

TECHNICAL FIELD

The present invention relates to a six-degree-of-freedom displacement measurement method for an exposure region on a wafer stage, which may be applied to a semiconductor lithography machine and belongs to the technical field of semiconductor manufacturing equipment.

BACKGROUND ART

During an exposure process of a lithography machine, a wafer is divided into multiple fields of view to be exposed respectively. During an exposure process of a field of view on the wafer, an exposure image is projected onto the wafer by the lens to form an exposure region. In order to ensure the exposure accuracy, the wafer stage is required to be leveled and focused, and to adjust the horizontal position, so as to ensure the relative position and angle between the exposure region and the lens. Thus, six-degree-of-freedom displacement measurement of the exposure region is particularly important. When this field of view is exposed, the wafer stage moves, so that the next field of view is moved to the exposure region. Throughout the exposure process, the position of exposure region on the wafer is constantly changing.

In the existing laser interferometer measurement method or planar grating measurement method, the flexibility of the movable platform is neglected, and the movable platform is taken as a rigid body, and the six-degree-of-freedom displacement of the exposure region is calculated by measuring the displacement of other position on the movable platform, so that the error is larger when the rigidity of the movable platform is lower. In the prior art, it is possible to measure six degrees of freedom of the movable platform by an integrated reading head. However, the reading head of the existing planar grating measurement system is mostly placed on the movable platform, such that a displacement of a fixed point on the movable platform is measured, but the six-degree-of-freedom displacement of the constantly changed exposure region cannot be measured, during the movement of the wafer stage. In addition, there is a measuring method which measures the displacement of other position of the movable platform, has considered the flexible modality of the movable platform, and calculates in the exposure region in real-time. However, the method has lower precision and complicated algorithm.

SUMMARY

An object of the present invention is to provide a six-degree-of-freedom displacement measurement method for an exposure region on a wafer stage to measure the six-degree-of-freedom displacement of the exposure region at any time during the movement of the movable platform of the wafer stage.

The technical solution of the present invention is provided as follows:

a six-degree-of-freedom displacement measurement method for an exposure region on a wafer stage, wherein the exposure region is a region formed by projecting an exposure light beam onto a movable platform, wherein the method comprises the following steps:

fixing a planar grating below a permanent magnet array of the movable platform such that a measurement surface of the planar grating faces a coil array, and fixing a reading head in a gap of the coil array such that a central line of the reading head coincides with a central line of a lens;

forming a measurement region on the planar grating by irradiating a measurement light beam of the reading head onto the planar grating, wherein a center B of the measurement region and a center A of the exposure region are located at the same vertical line;

obtaining a six-degree-of-freedom pose $(p_x, p_y, p_z, \theta_x, \theta_y, \theta_z)$ of the measurement region at a moment by measurement with the reading head and the planar grating, wherein $(p_x, p_y, p_z)$ is the coordinate of the center B of the measurement region, and $\theta_x, \theta_y, \theta_z$ are included angles formed between the normal line of a plane, in which the measurement region is located, along the positive Z direction and coordinate axes X, Y and Z, respectively;

calculating and obtaining a six-degree-of-freedom pose of the exposure region by substituting the six-degree-of-freedom pose of the measurement region into $(p_x', p_y', p_z', \theta_x', \theta_y', \theta_z') = (p_x + L \cos \theta_x, p_y + L \cos \theta_y, p_z + L \cos \theta_z, \theta_x, \theta_y, \theta_z)$, wherein a part of the movable platform covered by the exposure region is taken as a rigid body approximately, wherein $p_x', p_y', p_z'$ represent the position of the center A of the exposure region, $\theta_x', \theta_y', \theta_z'$ represent included angles formed between the normal line of a plane, in which the exposure region is located, along the positive Z direction and the coordinate axes X, Y and Z, respectively, and L is the distance between the center A and the center B; and obtaining the six-degree-of-freedom displacement of the exposure region from a previous moment to a next moment by subtracting the six-degree-of-freedom pose of the exposure region at the previous moment from the six-degree-of-freedom pose of the exposure region at the next moment when the movable platform moves to the next moment.

Compared with the technical solution in the prior art, the present invention has the following advantages and outstanding technical effects: in the technical solution provided by the present invention, the six-degree-of-freedom displacement of the exposure region at any time during the movement of the wafer stage is measured through the ingenious measurement solution; the measurement complexity is greatly reduced and the measurement precision is improved, and especially, the six-degree-of-freedom displacement of the exposure region can be precisely measured at any time even if the movable platform has high flexibility.

Figure 1:
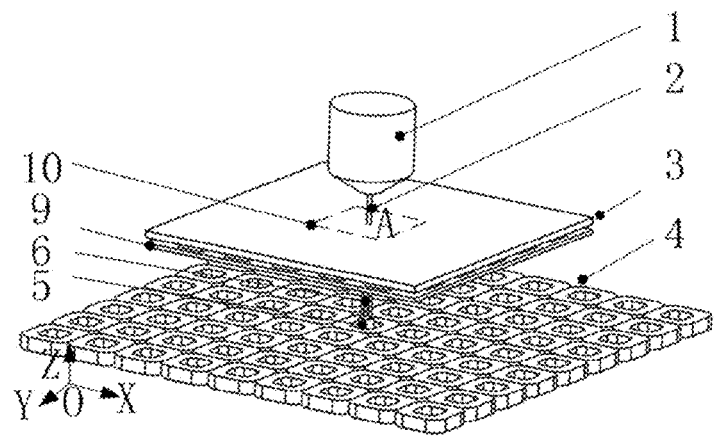
FIG. 1 is a schematic view showing an embodiment of the six-degree-of-freedom displacement measurement method for the exposure region on the wafer stage provided by the present invention.

In the drawings: 1—lens, 2—exposure light beam, 3—movable platform, 4—coil array, 5—reading head, 6—measurement light beam, 7—back plate, 8—permanent magnet array, 9—planar grating, 10—exposure region, 11—measurement region.

DETAILED DESCRIPTION OF EMBODIMENTS

Hereinafter, the implementations of the present invention are further explained in detail in connection with the accompanying drawings.

Figure 2:
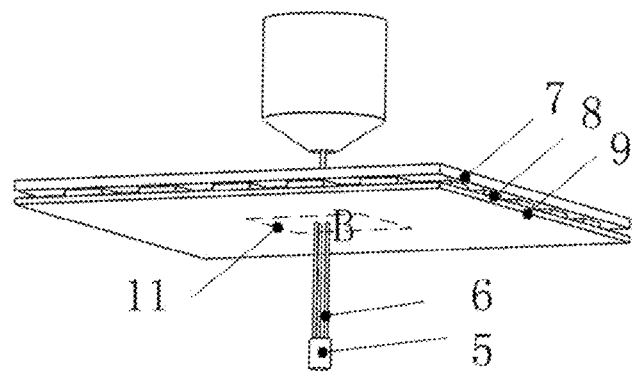
FIG. 2 is a schematic view showing the measurement device in the embodiment.

FIG. 1 is a schematic view showing an embodiment of the six-degree-of-freedom displacement measurement method for the exposure region on the wafer stage provided by the present invention. The wafer stage comprises a coil array 4 and a movable platform 3, and the coil array 4 consists of coils arranged in a plane. In the present embodiment, square coils are used. FIG. 2 is a schematic view showing the measurement device in the embodiment. The movable platform 3 comprises a permanent magnet array 8 and a back plate 7, and the permanent magnet array 8 is bonded to the bottom of the back plate 7. The permanent magnet array 8 employs a two-dimensional permanent magnet array, and in this embodiment, a two-dimensional halbach-type permanent magnet array is used. A planar grating 9 is fixed below the permanent magnet array 8 such that the measurement surface faces the coil array 4. A reading head 5 is fixed in a gap of the coil array 4. The gap may be a gap in the center of a coil or a gap formed by removing a coil. In the present embodiment, the reading head 5 is fixed in the gap of the coil. A central line of the reading head 5 coincides with a central line of a lens 1. An exposure light beam 2 of the lens 1 is projected onto the movable platform 3 to form the exposure region 10. As shown in FIG. 2, a measurement light beam 6 of the reading head 5 is incident on the planar grating 9 to form a measurement region 11. The measurement region 11 and the exposure region 10 may have a circular shape, square shape or rectangle shape and the like, and have a square shape in the present embodiment. The center A of the exposure region 10 and the center B of the measurement region 11 are located at the same vertical line.

Figure 3:
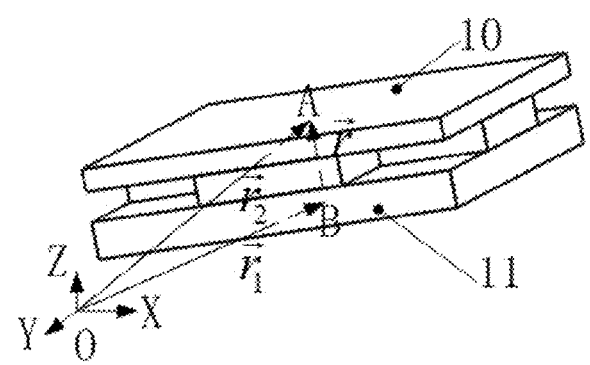
FIG. 3 is a schematic view showing the pose calculation in the embodiment.

FIG. 3 is a schematic view showing the pose calculation in the embodiment. The part of the movable platform covered by the exposure region 10 is shown in the figure. A stationary coordinate system O-XYZ is fixed on the coil array 4. The position vector from the origin O to the center B of the measurement region 11 is $\vec{r}_1$, the position vector from the origin O to the center A of the exposure region 10 is $\vec{r}_2$, and the vector from the point B to the point A is $\vec{r}$. The six-degree-of-freedom pose of the measurement region 11 obtained by using the reading head 5 and planar grating 9 is $(p_x, p_y, p_z, \theta_x, \theta_y, \theta_z)$, wherein $(p_x, p_y, p_z)$ is the coordinate of the center B of the measurement region 11, and $\theta_x, \theta_y, \theta_z$ are the included angles between the normal line of the plane, in which the measurement region 11 is located, in the positive Z direction and the coordinate axes X, Y and Z, respectively, which may refer to the reading head capable of measuring six degrees of freedom of a movable platform mentioned in "A six-degree-of-freedom surface encoder for precision positioning of a planar motion stage" provided by Xinghui Li, etc. Assuming that the distance between the points A and B is L, then $\vec{r} = L(\cos\theta_x, \cos\theta_y, \cos\theta_z)$, and the position vector $\vec{r}_2$ of the point A can be calculated by the following formula:

$$\vec{r} = (p_x', p_y', p_z') = \vec{r}_1 + \vec{r} = (p_x + L\cos\theta_x, p_y + L\cos\theta_y, p_z + L\cos\theta_z),$$

wherein $p_x', p_y', p_z'$ represent the position of the center A of the exposure region 10.

As the area of the exposure region 10 is small, the part of the movable platform covered by the exposure region 10 may be taken as a rigid body approximately, and when the whole movable platform 3 moves, or is deformed due to vibration, the included angles $(\theta_x', \theta_y', \theta_z')$ between the normal line of the plane, in which the exposure region 10 is located, in the positive Z direction and the coordinate axes X, Y and Z respectively, are equal to the included angles between the normal line of the plane, in which the measurement region 11 is located, in the positive Z direction and the coordinate axes X, Y and Z respectively, that is, $(\theta_x', \theta_y', \theta_z') = (\theta_x, \theta_y, \theta_z)$.

In this way, the six-degree-of-freedom pose of the exposure region 10 is calculated by using the six-degree-of-freedom pose of the measurement region 11, that is, $$(p_x', p_y', p_z', \theta_x', \theta_y', \theta_z') = (p_x + L\cos\theta_x, p_y + L\cos\theta_y, p_z + L\cos\theta_z, \theta_x, \theta_y, \theta_z),$$

wherein $p_x', p_y', p_z'$ represent the position of the center A of the exposure region, $\theta_x', \theta_y', \theta_z'$ represent the included angles between the normal line of the plane, in which the exposure region is located, in the positive Z direction and the coordinate axes X, Y and Z, respectively, $(p_x, p_y, p_z)$ is the coordinate of the center B of the measurement region, $\theta_x, \theta_y, \theta_z$ are the included angles between the normal line of the plane, in which the measurement region is located, in the positive Z direction and the coordinate axes X, Y and Z, respectively; and L is the distance between the center A and the center B.

When the movable platform moves to the next moment, the six-degree-of-freedom displacement of the exposure region from the previous moment to the next moment is obtained by subtracting the six-degree-of-freedom pose of the exposure region at the previous moment from the six-degree-of-freedom pose of the exposure region at the next moment.

The six-degree-of-freedom displacement signal of the exposure region calculated according to the present invention can be used for feedback control to control the leveling and focusing as well as horizontal movement of the exposure region; in addition, the six-degree-of-freedom displacement signal of the exposure region can be used for feedforward control which compensates the error of the six-degree-of-freedom displacement of the exposure region, obtained in the current moment, to the next moment in advance, so as to reduce the error of the leveling and focusing as well as the error of the horizontal movement.

What is claimed is:

1. A six-degree-of-freedom displacement measurement method for an exposure region on a wafer stage, wherein the exposure region (10) is a region formed by projecting an exposure light beam (2) onto a movable platform (3), wherein the method comprises following steps:

fixing a planar grating (9) below a permanent magnet array (8) of the movable platform such that a measurement surface of the planar grating faces a coil array (4), and fixing a reading head (5) in a gap of the coil array such that a central line of the reading head coincides with a central line of a lens (1);

forming a measurement region (11) on the planar grating by irradiating a measurement light beam (6) of the reading head onto the planar grating, wherein a center B of the measurement region and a center A of the exposure region (10) are located at a same vertical line;

obtaining a six-degree-of-freedom pose $(p_x, p_y, p_z, \theta_x, \theta_y, \theta_z)$ of the measurement region at a moment by measurement with the reading head and the planar grating, wherein $(p_x, p_y, p_z)$ is a coordinate of the center B of the measurement region, and $\theta_x, \theta_y, \theta_z$ are included angles formed between a normal line of a plane, in which the measurement region is located, along a positive Z direction and coordinate axes X, Y and Z, respectively;

calculating and obtaining a six-degree-of-freedom pose of the exposure region by substituting the six-degree-offreedom pose of the measurement region into $(p_x', p_y', p_z', \theta_x', \theta_y', \theta_z')=(p_x+L\cos\theta_x, p_y+L\cos\theta_y, p_z+L\cos\theta_z, \theta_y, \theta_z)$, wherein a part of the movable platform covered by the exposure region is taken as a rigid body approximately, wherein $p_x', p_y', p_z'$ represent a position of the center A of the exposure region, $\theta_x', \theta_y', \theta_z'$ represent included angles formed between a normal line of a plane, in which the exposure region is located, along the positive Z direction and the coordinate axes X, Y and Z, respectively, and L is a distance between the center A and the center B; and obtaining a six-degree-of-freedom displacement of the exposure region from a previous moment to a next moment by subtracting the six-degree-of-freedom pose of the exposure region at the previous moment from the six-degree-of-freedom pose of the exposure region at the next moment when the movable platform moves to the next moment.

\* \* \* \* \*